(12) United States Patent
Bendz et al.

(10) Patent No.: US 6,274,398 B1
(45) Date of Patent: Aug. 14, 2001

(54) METHOD FOR WAVELENGTH COMPENSATION IN SEMICONDUCTOR PHOTONIC IC

(75) Inventors: Eskil Bendz; Lennart Lundqvist, both of Kista (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/466,225

(22) Filed: Dec. 17, 1999

(30) Foreign Application Priority Data

Dec. 18, 1998 (SE) .................................................. 9804422

(51) Int. Cl.$^7$ .................................................. H01L 21/66
(52) U.S. Cl. .................................................. 438/16
(58) Field of Search .................. 438/7, 16, 22, 438/29, 31, 37, 46, 47, 478, 493, 494, 496; 257/76, 98; 372/43, 44, 45, 50; 117/2, 84, 85, 86

(56) References Cited

U.S. PATENT DOCUMENTS 5,436,195  7/1995  Kimura et al. .
5,543,353 *  8/1996  Suzuki et al. .

FOREIGN PATENT DOCUMENTS 0 472 221  2/1992  (EP) .

OTHER PUBLICATIONS

International Search Report No. SE 98/01467—mailed Oct. 8, 1999.

Japanese Patent Publication 10–56229, Feb. 24, 1998, Method for Manufacturing Semiconductor Optical Integrated Element, (Abstract).

T. Sasaki et al., "Novel tunable DBR–LDs grown by selective MOVPE using a waveguide–direction band–gap energy control technique", Optical Fibre Communication Conference (San Jose).

* cited by examiner

Primary Examiner—Keith Christianson
(74) Attorney, Agent, or Firm—Burns, Doane, Swecker & Mathis, L.L.P.

(57) ABSTRACT

The present invention relates to a method for manufacturing a plurality of semiconductor photonic integrated circuit comprising at least a laser and a modulator connected optically to one another. Each laser and modulator has a waveguide layer being implemented on a single substrate, where said modulator is formed by use of a selective area growth technique. By providing modulator masking parts with selectable width to compensate a difference in band-gap energy in the waveguide layer between the laser and the modulator a approximate uniform difference in band-gap energy between the optically connected laser and modulator may be obtained.

10 Claims, 3 Drawing Sheets

METHOD FOR WAVELENGTH COMPENSATION IN SEMICONDUCTOR PHOTONIC IC

TECHNICAL FIELD

The present invention relates to a method for wavelength compensation in a photonic device manufactured on a semiconductor substrate using selective area growth. The invention further relates to an integrated circuit comprising a photonic device manufactured by this method.

BACKGROUND TO THE INVENTION

There exists what is known as selective area growth (SAG) technique that utilises insulating film patterning masks in integrally fabricating, on the same semiconductor substrate, such semiconductor photonic devices as semiconductor laser, optical modulator, optical switch, photo detector and optical amplifier of different functions. The selective area growth technique involves primarily forming insulating film patterning masks over the semiconductor substrate so as to permit vapour phase growth of semiconductor crystals in unmasked areas, i.e. exposed areas of the substrate. During manufacture of target semiconductor photonic devices, the width of the insulating film mask and that of the exposed area over the semiconductor substrate are varied in the light transmission direction of these devices, and vapour phase growth of an alloy semiconductor is effected. This causes alloy semiconductor layers of different growth layer compositions and of different layer thickness to be formed automatically in the same process and in accordance with the width of the insulating film mask and that of the exposed area. This is because the density gradient in vapour phase of various materials that contains the atoms constituting alloy semiconductor crystals, and the effective diffusion length involved, vary from material to material.

The effective diffusion length mainly consists of two mechanisms, surface diffusion and re-diffusion. An atom, e.g. indium (In), that comes in contact with the surface of the mask, may be subject to the surface diffusion mechanism where the atom migrate along that surface until it finds a suitable substance to attach to, e.g. indium phosphide (InP). The atom may, on the other hand, be subject to the re-diffusion mechanism where the atom re-diffuses from the surface and float around until the atom collide with another atom. This collision causes the atom to drop to the surface again where it will attach if there is a suitable substance, as described earlier, or be subject to the surface diffusion or re-diffusion mechanism again. The re-diffusing mechanism is the important part in SAG.

The average distance an atom moves before it attach is called diffusion length. The diffusion length on a substrate of InP is approximately 1 $\mu$m for surface diffusion and approximately 10 to 100 $\mu$m for re-diffusion, dependent on pressure during SAG.

Different atoms belonging to the same group of element, e.g. group III element, may have different diffusion lengths, for instance, gallium (Ga) has a considerable longer diffusion length, approx. 110 $\mu$m, compared to indium (In), approx. 15 $\mu$m. These values is temperature and pressure dependent, but the ratio between them is more or less constant. The difference in diffusion length will cause a change in the composition of an epitaxially grown material, consisting of atoms belonging to the same group of element with different diffusion lengths, close to the masks. Furthermore, an increased amount of material will appear close to each mask due to diffusion from the surface of the mask.

U.S. Pat. No. 5,543,353 by Makoto et al. disclose a method for manufacturing devices, such as a laser and a modulator, in a single step using a single mask having different mask widths in the light transmission direction of these devices.

During selective area growth in a reactor, variations in the composition of a grown layer may appear due to the type of reactor used, for instance with an AIXTRON reactor equipment. A large variation will occur when the substrate is fixedly mounted in a reactor chamber and the gases, used for epitaxial growth of a waveguide layer, for instance, InGaAsP or InGaAs, are introduced in the chamber from one direction. The variations can be detected and measured by photo luminescence measuring techniques, where a variation in band-gap energy of the waveguide layer is detected and presented as a wavelength variation across the substrate. An example of this wavelength variation is shown in FIG. 1 and is described in more detail below.

When manufacturing photonic devices, such as a laser and a modulator, in different steps and in the same or different reactor, the difference in wavelength between the photonic devices may vary dependent of the position of the photonic device on the substrate. This results in a low yield of functioning devices on the substrate, since the wavelength difference, so called detuning, between the laser and the modulator is important.

SUMMARY OF THE INVENTION

It is an object with the present invention to provide a method for manufacturing a plurality of semiconductor photonic integrated circuit which overcomes the prior art problems.

In achieving the foregoing and other objects of the invention, there is provided a method of manufacturing a plurality of semiconductor photonic integrated circuits on a single semiconductor substrate, each of said integrated circuits comprising at least a first and a second photonic device connected optically one another, said method comprising the steps of: (i) growing a first set of layers, comprising at least a first waveguide layer, to form said first photonic device on said substrate, (ii) providing an insulating film mask comprising masking parts covering each of said first photonic devices so as to define covered and exposed areas on said substrate, (iii) removing said first set of layers from said exposed areas, (iv) selecting an area for each second photonic device adjacent to and in a light transmission direction of each of said first photonic devices, and (v) growing a second set of layers, comprising at least a second waveguide layer, to form said second photonic device by use of a selective area growth process, wherein said method further comprises the steps of: (a) measuring variations in band-gap energy, across the substrate, in a waveguide layer corresponding to the second waveguide layer on a reference substrate, prior to step (ii), said variations resulting from the selective area growth process, which in turn causes a variation in detuning between the first and the second photonic device across the substrate, due to said variations in band-gap energy in the second waveguide layer, (b) providing said insulating film mask in step (ii) with at least one additional masking part adjacent to each of said areas, each additional masking part having a selected length and a selectable width, and being placed substantially parallel to the light transmission direction of each respective first photonic device, and (c) selecting the width of each additional masking part, to correspond to said measured variations in band-gap energy, to at least partially compensate the variations in band-gap energy in the second waveguide layer across the substrate, thereby reducing the variation in detuning between the first and the second photonic device across the substrate.

An advantage with the present invention is that an apparatus used for selective area growth processes resulting in a varied growth across the substrates still may be used with an increased yield.

Another advantage with the present invention is that the compensation of the difference in band-gap energy is easily obtained at very low cost.

The invention is further described in the following with reference to the accompanying drawings.

DETAILED DESCRIPTION ON PREFERRED EMBODIMENTS

Figure 1:
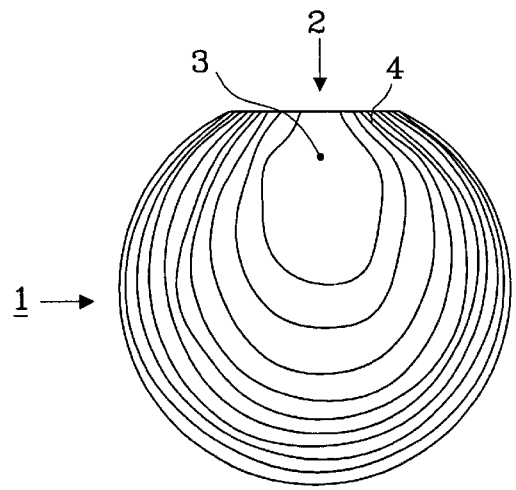
FIG. 1 shows a top view of a wafer illustrating a waveguide layer in a modulator having varied band-gap energy.

FIG. 1 shows a top view of a wafer 1 illustrating an optical waveguide layer in a modulator having variations in band-gap energy across the wafer. This variation is due to the type of reactor used in manufacturing the layer. As described before this occurs in a reactor where the wafer is fixedly mounted during the epitaxial growth process and the used gases are introduced from one direction 2. The variations are measured with a photo luminescence measuring apparatus and the result is presented in decreasing wavelength compared to a highest wavelength, which is obtained at a reference point 3, near the top middle of the wafer. The increasing wavelength difference is divided into intervals of 5 nm, where each line 4 indicates a 5 nm drop from the previous line counting from the reference point 3. The variations across the wafer 1 is in this example more than 45 nm, which is unacceptable when manufacturing a modulator that is working with a semiconductor laser, having a fixed emitting wavelength, i.e. a fixed band-gap energy.

Figure 2:
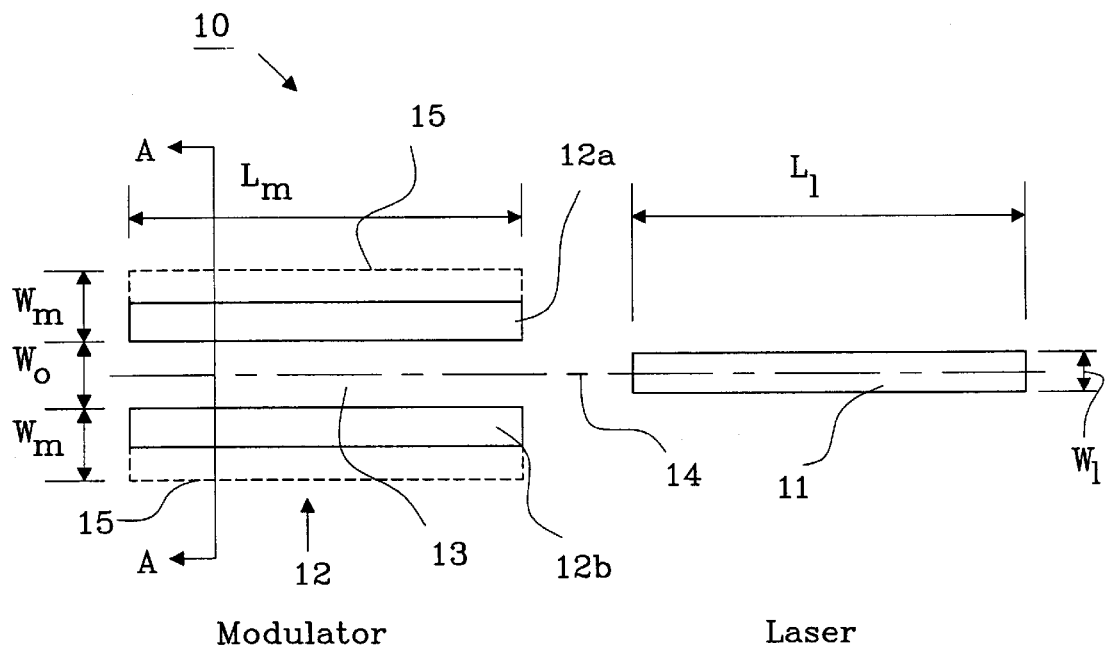
FIG. 2 shows a top view of an insulating film mask layout according to the present invention.

FIG. 2 shows a part of an insulating mask layout consisting of a plurality of circuit masks 10 for manufacturing a laser and a modulator according to the present invention. The circuit mask 10 comprises two masking parts, a laser part 11, which covers and protects a first set of layers, forming the laser, during subsequent manufacturing steps, and a modulator part 12, which defines an area 13 where a second set of layers forming the modulator is to be manufactured. The area 13 being in a light transmission direction of the laser, illustrated with a line 14.

The dimensions, length $L_1$ and width $W_1$ of the laser masking part 11, are substantially equal across, dependent on the type of the implemented laser, to protect the laser when the modulator is manufactured. The mask dimensions for a distributed feedback laser having a band-gap energy corresponding to a wavelength of approximately 1550 nm may, as an non-limited example, be $L_1 \approx 400$ μm and $W_1 \approx 12$ μm.

The modulator masking part 12 consists in this example of two separate parts 12a and 12b, having essentially equal dimensions and being arranged on equal distances to the line 14 with a fixed intermediate distance $W_o$. Each mask having a selected length $L_m$, arranged in parallel with the line 14, and a selectable width $W_m$ preferably in the interval 0–20 μm. The dashed line 15 indicating the upper limit of the width.

The selectable width is used for changing the composition and the thickness of grown layers close to the masks, especially in the area 13, during a selective area growth process. As is described earlier, in the background to the invention, an increase of substances with a shorter diffusion length will occur close to the masks, as well as a general increase of material. A preferred intermediate distance $W_o$ between the modulator masking parts 12a, 12b is in the range of 1 to 3 times of said shorter diffusion length, and may obtain a good composition of an optical waveguide layer in the modulator and good pace in epitaxial growth.

The semiconductor substrate is preferable made of indium phosphide (InP), and the optical waveguide layer in the modulator is preferable made of indium gallium arsenide phosphide $In_xGa_{1-x}As_yP_{1-y}$, where x, y have a value ranging from 0 to 1, InGaAsP in short.

A certain increase in the width of the modulator masking part corresponds to an increased wavelength close to said modulator masking part 12, when growing a waveguide layer.

When a plurality of photonic devices, comprising a laser and a modulator, are to be implemented on the same substrate, where the first set of layers for the laser is manufactured in a first step and the optical waveguide layer for the modulator have been found out to have the variations shown in FIG. 1, the composition of the waveguide layer in all areas intended to be used as modulators may need to be compensated. This compensation is performed by selecting the width of the modulator masks to correspond to the wavelength compensation needed dependent on the position on the substrate.

Figure 3A:
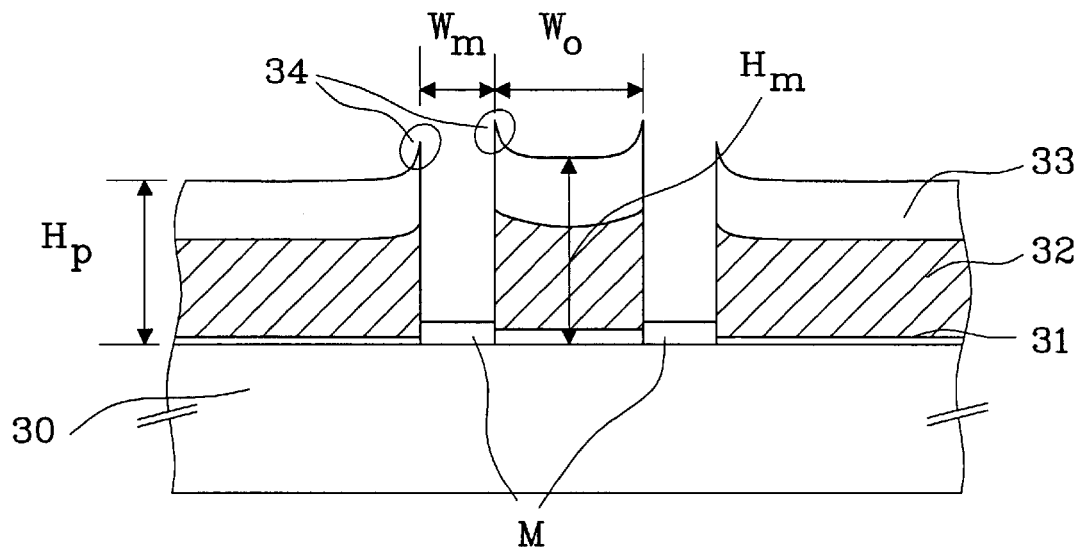
FIGS. 3a and 3b shows a cross-section along A—A in FIG. 2 according to different implementations of the present invention.
Figure 3B:
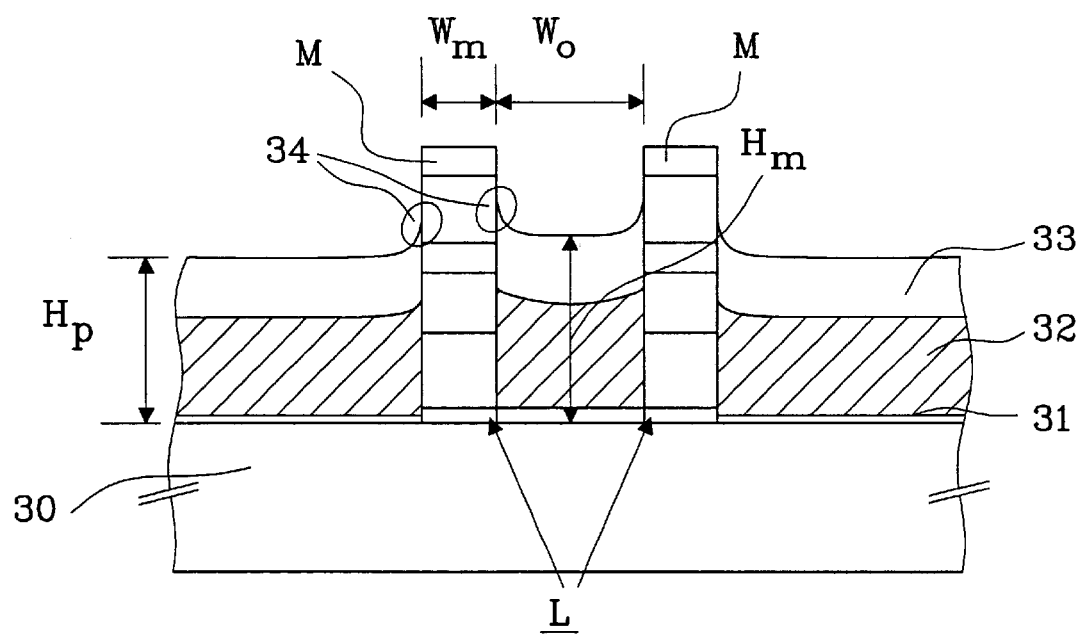

FIGS. 3a and 3b are cross-sections along line A—A in FIG. 2 according different implementations of the present invention using the mask in FIG. 2 as non-limited examples where:

an intermediate distance–$W_o$=20 μm, and
a modulator mask width–$W_m$=10 μm.

In FIG. 3a, the inventive mask M is arranged directly on a semiconductor substrate 30. This can be achieved by forming the first photonic device, providing a protective insulating film mask over said device, and etching the substrate clean from any material not protected by said insulating masks.

In FIG. 3b, the inventive mask M is arranged on layers of material L, remains of the laser fabrication, at the same time as the protective insulating film is arranged on top of the first set of layers forming the laser. The areas not covered by the inventive mask M or the protective mask is etched down to the substrate 30.

Thus, both of these implementations creates an equivalent modulator during the selective area growth process described below.

During selective area growth of a modulator, using the above masking particulars, a number of layers are obtained consisting, for instance, of n-InP/InGaAsP/p-InP on a semiconductor substrate 30 of n-InP, where n-InP is an indium phosphide layer doped with a surplus of electrons and p-InP is an indium phosphide layer with a surplus of holes.

The first layer 31 of n-InP is called a spacer, which is used to make the surface under the next layer 32, waveguide layer, as free of defects as possible. If the substrate is of a very high quality this layer may be omitted.

Increased thickness of the deposited material 34 can be seen at the edges of the mask due to surface diffusion. This variation in thickness is negligible since only a narrow portion of the material between the masks is used for manufacturing the modulator. Furthermore there is an increase in the modulator height $H_m$ compared to the overall height $H_p$, which is due to the shorter diffusion length of indium, which in turn gives an enrichment of indium close to the masks.

Figure 4A:
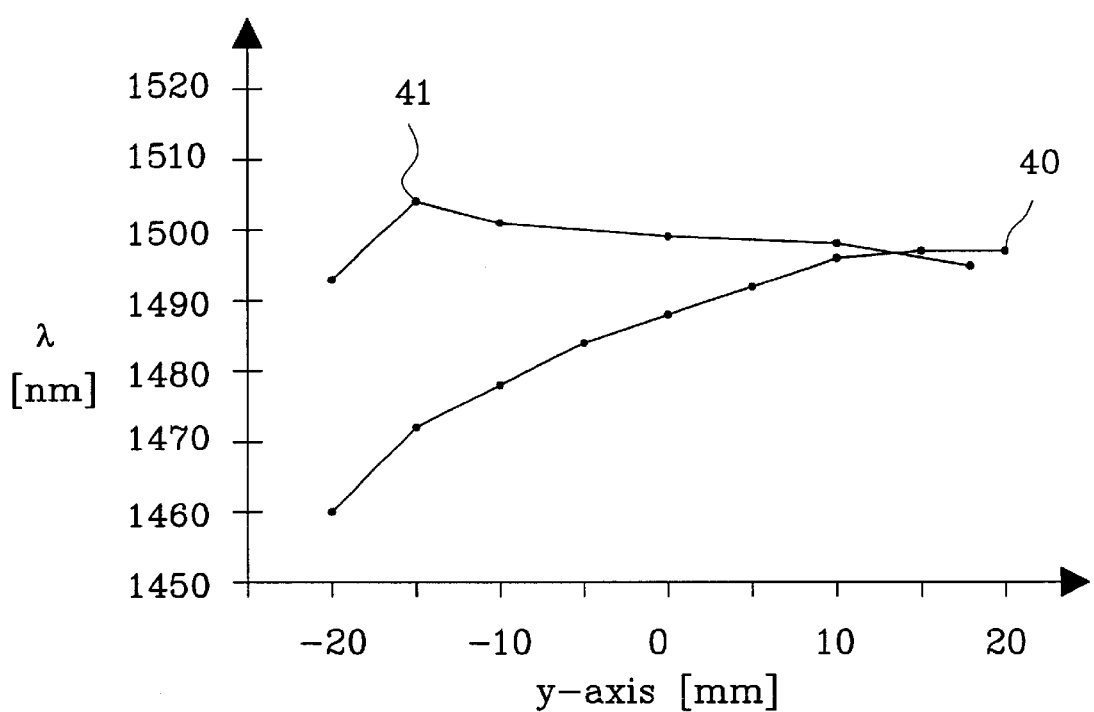
FIGS. 4a and 4b shows a comparison between a normal and a compensated waveguide layer in a modulator according to the present invention.
Figure 4B:
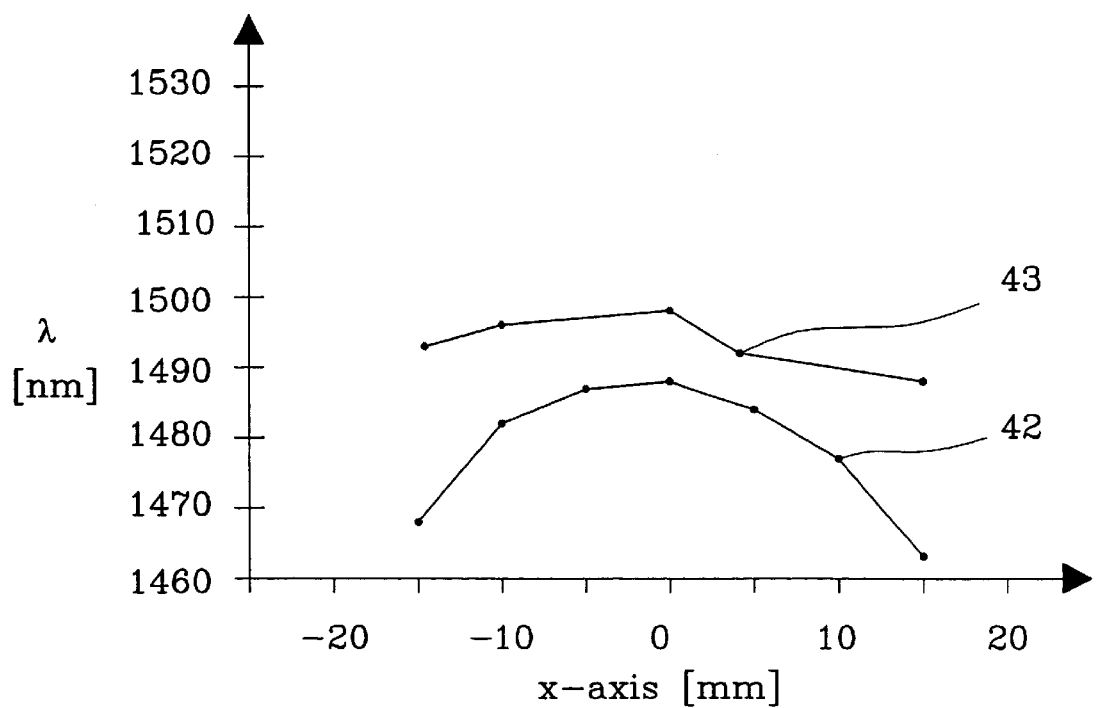

FIGS. 4a and 4b shows a comparison between a normal and a compensated waveguide layer in a modulator according to the present invention, where the overall increased wavelength clearly can be seen as well as the compensating effect of the variable width of the modulator masks.

FIG. 4a shows values of a measurement of wavelength λ as a function of y-axis of the modulator waveguide layer. The values are presented along the y-axis crossing the centre of the substrate (x=0). The lower line 40 represents a normal substrate without any compensating masks during the selective area growth process. The values of the wavelength are decreasing when going from right to left, as shown in FIG. 1 going from the top to the bottom. On the other hand, the upper line 41, which represent a compensated waveguide layer, shows only a variation of 10–11 nm over the same distance as the lower line varies almost 40 nm.

FIG. 4b shows values of a measurement of wavelength λ as a function of x-axis of the modulator waveguide layer. The values are presented along the x-axis crossing the centre of the substrate (y=0). The lower line 42, representing the same normal substrate as measured in FIG. 4a, have a maximum at x=0, and decreases when going to the right and the left, as shown in FIG. 1. On the other hand, the upper line 43, which represents the compensated waveguide layer, only shows a variation of 10–11 nm over the same distance as the lower line varies almost 25 nm.

The result of these measurements shows that a compensated waveguide layer may be manufactured to obtain a considerable lower variations in wavelength variations across a wafer, where the selective area growth process, without any compensating masks, achieve a large variation in wavelength, i.e. band-gap energy.

A fundamental part of the inventive method is to characterise the variations in band-gap energy across the substrate on a reference substrate, to be able to select the desired width of the compensating masks. This characterisation can be done by forming a plurality of a first photonic device on a reference substrate, cover said first device and then form a second photonic device, as described in the preamble of claim 1, and thereafter measure the wavelength in the selected area for the second photonic device, by photo luminescence measuring techniques.

The inventive method may naturally fully compensate the wavelength in the waveguide layer of the modulator, so as the difference in wavelength, the so called detuning, between the laser and the modulator is reduced to an acceptable level, for instance approximately 60 nm.

What is claimed is:

1. A method for manufacturing a plurality of semiconductor photonic integrated circuits on a single semiconductor substrate, each of said integrated circuits comprising at least a first and a second photonic device connected optically to one another, said method comprising the steps of:
   (i) growing a first set of layers, including at least a first waveguide layer, to form said first photonic device on said substrate,
   (ii) providing an insulating film mask comprising masking parts covering each of said first photonic devices so as to define covered and exposed areas on said substrate,
   (iii) removing said first set of layers from said exposed areas,
   (iv) selecting an area for each second photonic device adjacent to and in a light transmission direction of each of said first photonic devices, and
   (v) growing a second set of layers, comprising at least a second waveguide layer, to form said second photonic device by use of a selective area growth process, wherein said method further comprises the steps of:
   (a) measuring variations in band-gap energy, across the substrate, in a waveguide layer corresponding to the second waveguide layer on a reference substrate, prior to step (ii), said variations resulting from the selective area growth process, which in turn causes a variation in detuning between the first and the second photonic device across the substrate, due to said variations in band-gap energy in the second waveguide layer,
   (b) providing said insulating film mask in step (ii) with at least one additional masking part adjacent to each of said areas, each additional masking part having a selected length and a selectable width, and being placed substantially in parallel to the light transmission direction of each respective first photonic device, and
   (c) selecting the width of each additional masking part, to correspond to said measured variations in band-gap energy, to at least partially compensate the variations in band-gap energy in the second waveguide layer across the substrate, thereby reducing the variation in detuning between the first and the second photonic device across the substrate.

2. Method according to claim 1, wherein the method comprises the step of providing said insulating film mask with two additional masking parts, adjacently placed to each of said areas, said masking parts being parallel and arranged on opposing sides of each area.

3. Method according to claim 2, wherein the method comprises the step of selecting an intermediate distance between said two additional masking parts, adjacent to all areas, to be substantially equal.

4. Method according to claim 3, wherein the method comprises the step of selecting said intermediate distance to be in the interval of 10 to 35 μm.

5. Method according to claim 3, wherein the method comprises the step of selecting said intermediate distance to be in the interval of 15 to 25 μm.

6. Method according to claim 1, wherein the method comprises the step of selecting said width to be in the interval of 0–20 μm.

7. Method according to claim 1, wherein the method comprises the step of selecting said first photonic device to be a semiconductor laser.

8. Method according to claim 7, wherein the method comprises the step of selecting said second photonic device to be a modulator optically connected to said semiconductor laser.

9. Method according to to claim 1, wherein said measuring step is performed by photo luminescence measuring techniques.

10. An integrated circuit, comprising at least a first and a second device connected optically to one another, characterised in said integrated circuit is manufactured using a method according to claim 1.

* * * * *